(12) United States Patent
Ito et al.

(10) Patent No.: US 7,795,613 B2
(45) Date of Patent: Sep. 14, 2010

(54) STRUCTURE WITH TRANSISTOR

(75) Inventors: Manabu Ito, Tokyo (JP); Masato Kon, Tokyo (JP); Mamoru Ishizaki, Tokyo (JP); Norimasa Sekine, Tokyo (JP)

(73) Assignee: Toppan Printing Co., Ltd. (JP)

( * ) Notice: Subject to any disclaimer, the term of this patent is extended or adjusted under 35 U.S.C. 154(b) by 94 days.

(21) Appl. No.: 11/787,554

(22) Filed: Apr. 17, 2007

(65) Prior Publication Data
US 2008/0258139 A1 Oct. 23, 2008

(51) Int. Cl.
*H01L 21/16* (2006.01)
(52) U.S. Cl. .................... 257/43; 257/E29.296
(58) Field of Classification Search .......... 257/43, 257/40, E29.296
See application file for complete search history.

(56) References Cited

U.S. PATENT DOCUMENTS

| 6,515,338 | B1 * | 2/2003 | Inumiya et al. | 257/368 |
| 2004/0059239 | A1 | 3/2004 | Jaffe et al. | 600/529 |
| 2006/0275540 | A1 * | 12/2006 | Kubota | 427/66 |
| 2006/0275926 | A1 * | 12/2006 | Carcia et al. | 438/1 |
| 2007/0024187 | A1 * | 2/2007 | Shin et al. | 313/504 |
| 2007/0254456 | A1 * | 11/2007 | Maruyama et al. | 438/458 |

FOREIGN PATENT DOCUMENTS

| WO | WO 98/34683 | 8/1998 |
| WO | WO 99/52581 | 10/1999 |

OTHER PUBLICATIONS

M.D. Groner et al., Gas Diccusion Barriers on Polymers using $Al_2O_3$ Atomic Layer Deposition, *Applied Physics Letters* 88, (2006).
P.E. Burrows et al., Ultra Barrier Flexible Substrates for Flat Panel Displays, *Displays* 22 (2001), pp. 65-69.
G.A. Abbas et al., A Study of ta-C, a-C:H and Si-a:C:H Thin Films on Polymer Substrates as a Gas Barrier, *Diamond and Related Materials* 13 (2004), pp. 1342-1345.
Ahmet G. Erlat et al., Mechanism of Water Vapor Transport throygh $PET/AlO_xN_y$ gas Barrier Films, *J. Phys. Chem. B*, 2004, 108, pp. 883-890.
Bryan D. Vogt et al., X-ray and Neutron Reflectibity Measurements of Moisture Transport through Model Multilayered Barrier Films for Flexible Displays, *Journal of Applied Physicl* 97, (2005).

(Continued)

*Primary Examiner*—Sue Purvis
*Assistant Examiner*—Selim Ahmed
(74) *Attorney, Agent, or Firm*—Squire, Sanders & Dempsey L.L.P.

(57) ABSTRACT

A structure with a transistor is disclosed comprising a substrate, a gas barrier layer on the substrate, and a transistor on the gas barrier layer. The transistor can include an oxide semiconductor layer. The oxide semiconductor layers can comprise In—Ga—Zn—O. A display, such as a liquid crystal display, can have such a structure.

4 Claims, 5 Drawing Sheets

OTHER PUBLICATIONS

A.S. da Silba Sobrinho et al., Transparent Barrier Coatings on Polyethylene Terephthalate by Single- and Dual-Frequency Plasma-Enhanvced Checmical Vapor Deposition, *J. Vac. Sci. Technol. A* (16)6, Nov./Dec. 1998, pp. 3190-3198.

Marc Schaepkens et al., Ultrahigh Barrier Coating Deposition on Polycarbonate Substrates, *J. Vac. Sci. Technol. A 22(4)*, Jul./Aug. 2004, pp. 1716-1722.

Kenji Nomura et al., Room-Temperature Fabrication of Transparent Flexible Thin-Film Transistors Using Amorphous Oxide Semiconductors, *Nature*, vol. 432, Nov. 25, 2004, pp. 488-492.

Hood Chatham, Oxygen Diffusion Barrier Properties of Transparent Oxide Coatings on Polymeric Substrates, *Surface and Coatings Technology* 78 (1996), pp. 1-9.

* cited by examiner

STRUCTURE WITH TRANSISTOR

BACKGROUND OF THE INVENTION

1. Field of the Invention

The present invention is related to a flexible transistor having an oxide semiconductor layer.

A transistor of the present invention can be used for devices such as a liquid crystal display, an organic light emitting display, a micro capsule type electrophoresis-type display, a photo-write type cholesteric liquid crystal type display, a TwistingBall type display, a toner type display, a movable film type display and an RFID (RadioFrequencyIdentification) sensor.

2. Description of the Related Art

Generally the transistor which used an amorphous silicon semi-conductor or a polysilicon semi-conductor as a driving transistor of electron device has been used. However, film formation temperature equal to or more than 200 degrees Celsius is required for manufacture of an amorphous silicon semi-conductor and polysilicon semi-conductor of high quality. Therefore, it was difficult to realize a flexible transistor with the use of an inexpensive plastic substrate.

The transistor which used organic semiconductor in semi-conductor layer is studied energetically to realize a flexible transistor with the use of an inexpensive plastic substrate. Because organic semiconductor can be made at cold temperature, organic semiconductor can be formed on a plastic substrate. However, mobility of organic semiconductor is extremely low. In addition, degradation of organic semiconductor is easy to occur. Therefore, practical use of organic semiconductor has not yet come.

In such a situation, for example, a transistor having a semi-conductor layer made of In—Ga—Zn—O, which showed high mobility even if it was made at room temperature, has been proposed. (K. Nomuraetal. Nature, 432, 488 (2004))

According to this literature, by using In—Ga—Zn—O as a semiconductor layer, a transistor having an excellent semi-conductor of about 10 $cm^2/Vs$ mobility on a polyethylene terephthalate substrate could be made in room temperature.

However, when In—Ga—Zn—O is made by sputter method, the semiconductor characteristic is extremely sensitively influenced by oxygen concentration during formation of film.

For example, when In—Ga—Zn—O is deposited under a condition of 1% oxygen flow rate (argon flow rate 100%), it becomes an electric conductor of which conductivity as a film is more than 1 (S/cm). On the other hand, when In—Ga—Zn—O is layered under a condition of 50% oxygen flow rate, it becomes a insulating material of which conductivity as a film is less than $1*10^{-13}$ (S/cm).

Oxygen concentration at a film formation surface of a semiconductor greatly influences the number of oxygen deficiency to be included in a semiconductor film. Therefore, in order to make a semiconductor characteristic stable, it is extremely important to control oxygen concentration at a film formation surface of a semi-conductor film.

When inorganic materials such as glass are used as a substrate, deoxidation from a substrate does not almost occur during deposition of a semiconductor. Therefore, control of oxygen concentration during deposition of semiconductor is easy.

However, when a plastic substrate is used as a substrate, deoxidation from a plastic substrate occurs. Therefore, control of oxygen concentration at a surface of semi-conductor film formation becomes very difficult.

In addition, water vapor contained in a plastic substrate scatters to a layer of a semi-conductor when time passes in a case of the transistor that a layer of a semi-conductor of In—Ga—Zn—O is formed on a plastic substrate. Therefore, mobility and an ON/OFF ratio of a transistor fall.

In the present invention, oxygen and water vapor from a plastic substrate are shielded by a gas barrier layer, and they do not go to an oxide semiconductor layer. And in the present invention, a flexible structure with a transistor of which characteristic is stable and of which mobility and on/off ratio are kept to be high is provided.

SUMMARY OF THE INVENTION

One embodiment of the present invention is disclosed. In the present invention, oxygen and water vapor from a substrate are shielded by a gas barrier layer, and they do not go to an oxide semiconductor layer. And in the present invention, a flexible structure with a transistor of which characteristic is stable and of which mobility and on/off ratio are kept high is provided.

In these drawings, 1 is a plastic substrate; 2 is a gas barrier layer; 3 is a semiconductor layer; 4 is a gate insulator; 5 is a gate electrode; 6 is a source electrode; and 7 is a drain electrode.

DESCRIPTION OF THE PREFERRED EMBODIMENTS

Figure 5:
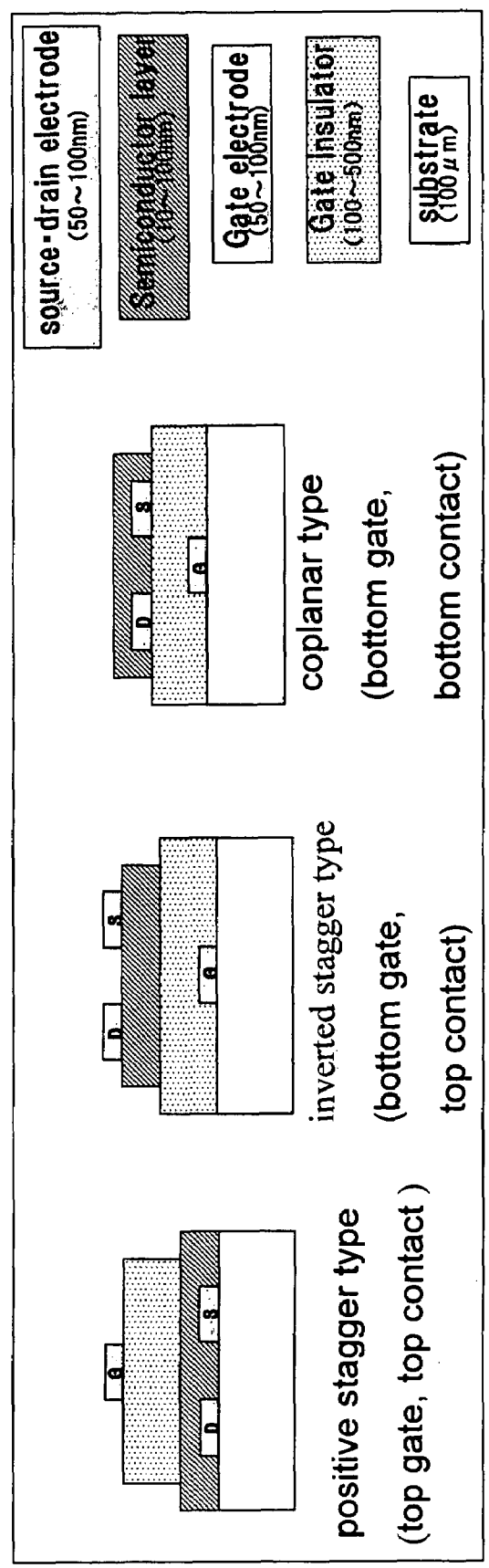
FIG. 5 is a constructional example of a structure with a transistor of the present invention.

For a transistor which can be used for the present invention, there are a positive stagger type (top gate, top contact), an inverted stagger type (bottom gate, top contact) and a coplanar type (bottom gate, bottom contact) as shown in FIG. 5.

A basic embodiment of the present invention is explained below.

In other words, a transistor having the following members is explained:

the oxide semiconductor layer that is formed on a plastic plate;

the source electrode that is arranged to be touching electrically the oxide semiconductor layer;

the drain electrode that is arranged to be touching electrically the oxide semiconductor layer and to be isolated by the source electrode;

the gate insulator (formed on the oxide semiconductor layer) that is located between the source electrode and the drain electrode when the plastic substrate is watched from right above; and the gate electrode that is formed on the gate insulator.

Figure 1:
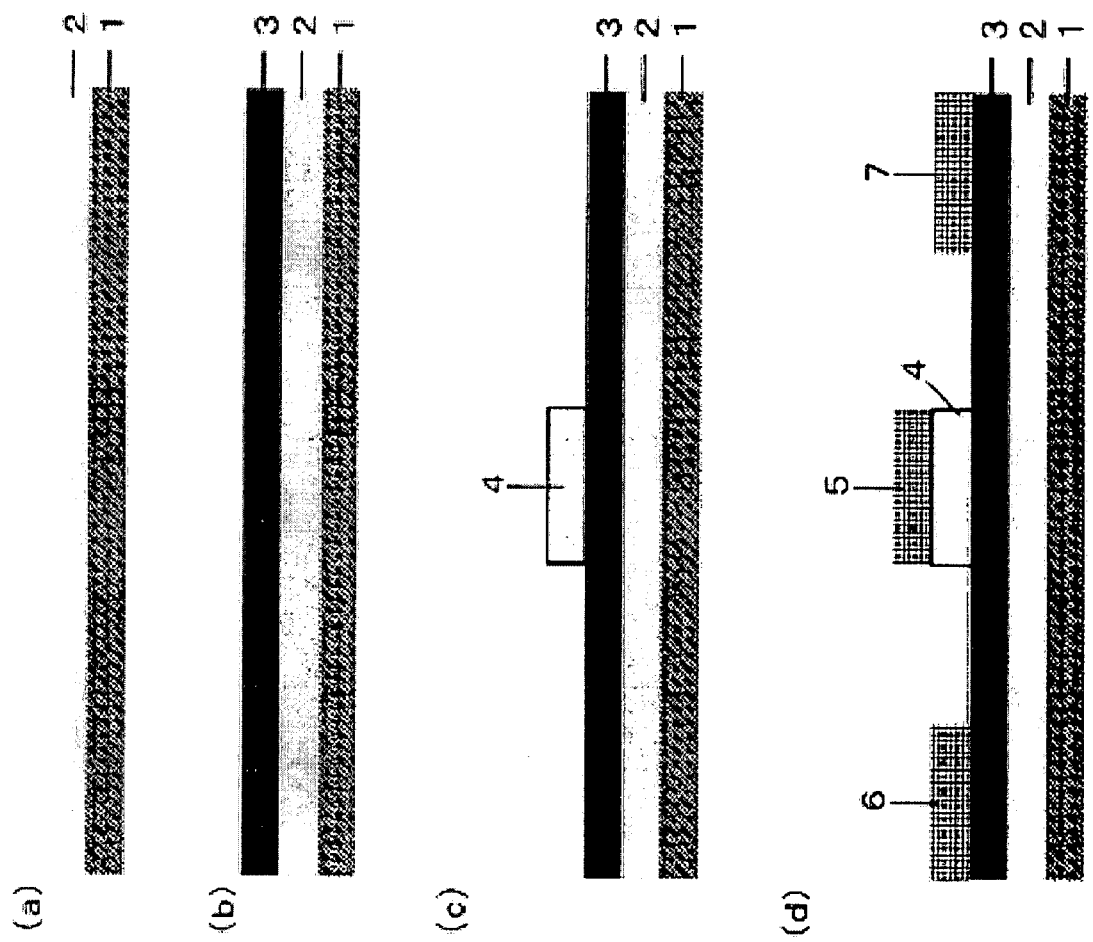
FIGS. 1 (*a*), (*b*), (*c*) and (*d*) are explanatory drawings which show a cross section structure of an example of a structure with a transistor of the present invention.

At first, gas barrier layer 2 is formed on plastic substrate 1. (FIG. 1 (a))

As for a material of a plastic substrate, polymethyl methacrylate, polyalylate, polycarbonate, polystyrene, polyethylen sulfide, polyethersulfone, polyolefin, polyethylene terephthalate, polyethylenenaphthalate, cyclo-olefin polymer, polyether sulfone, triacetylcellulose, a polyvinyl fluoride film, ethylene-tetrafluoroethylene copolymer resin, weatherable polyethylene terephthalate, weatherable polypropylene, glass fiber-reinforced acryl resin film, glass fiber-reinforced polycarbonate, polyimide, transparent polyimide, fluorinated resin, cyclic polyolefin resin and poly acrylic resin can be used, but it is not limited to these materials.

These materials may be used alone, and a composite substrate having two or more kinds of materials may be used.

For a material of gas barrier layer 2, inorganic oxide and inorganic nitride can be used. To be concrete, oxidation silicon, silicon nitride, aluminium oxide, magnesium fluoride, magnesium oxide, yttria can be used alone, or a mixture including two or more kind of these materials can be used, but usable materials are not limited to these materials. Oxidation silicon, silicon nitride and aluminium oxide are preferable used from the viewpoint of good gas barrier performance, inexpensiveness of manufacturing cost and transparency.

For film formation method of gas barrier layer 2, vacuum evaporation method, ion plating method, sputter method, laser ablation method, plasma CVD) technique, photo-CVD, hot wire CVD method, spin coat method, dip coat method, screen printing, letterpress printing, intaglio printing, lithography and ink jet method can be used, but usable methods are not limited to these methods.

Gas barrier layer 2 may be opaque and may be transparent. When all of a plastic substrate, a gas barrier layer, a semiconductor layer, a gate insulator and an electrode are transparent, a transparence transistor can be realized.

Next, semiconductor layer 3 is formed on gas barrier layer 2.

For materials of semiconductor layer 3, zinc oxide, indium oxide, tin oxide, tungsten oxide and zinc oxide gallium indium which are oxides including one or more element among zinc, indium, tin, tungsten, magnesium and gallium can be used, but usable materials are not limited to these materials. Structures of these materials may be any of monocrystal, polycrystal, crystallite, mixed crystal of crystal/amorphous, nanocrystals embedded in amorphous and amorphous. As for the film thickness of semiconductor layer, it is preferable more than 20 nm.

For film formation method of semiconductor layer 3, sputter method, pulsed laser deposition, vacuum evaporation method, CVD (Chemical Vapor Deposition) method, MBE (Molecular Beam Epitaxy) method, spin coat method, dip coat method, screen printing, letterpress printing, intaglio printing, lithography and ink jet method can be used, but sputter method, pulsed laser deposition, vacuum evaporation method and CVD (Chemical Vapor Deposition) method are preferable.

RF magnetron sputtering technique and DC sputter method can be used for sputter method. Heating evaporation, electron beam evaporation and ion plating method can be used for a vacuum evaporation method. Hot wire CVD method and plasma CVD technique can be used for CVD method. But usable methods are limited to these methods.

Next, gate insulator 4 is formed on semiconductor layer 3.

For material of gate insulator 4, silicon oxide, silicon nitride, aluminium oxide, tantalum oxide, yttria, hafnium oxide, hafnium aluminates, oxidation zirconia, titanium oxide, polyethylene terephthalate, polyethylenenaphthalate, polypropylene, cyclo-olefin polymer, polyamide, polyether sulfone, polymethyl methacrylate, polycarbonate, polyalylate, polyethylen, polystyrol, teflon (registered mark), ebonite, epoxy and lacquer tree can be used.

For a manufacturing method of gate insulator 4, vacuum evaporation method, ion plating method, sputter method, laser ablation method, plasma CVD (Chemical Vapor Deposition) method, photo-CVD, hot wire CVD method, spin coat method, dip coat method, screen printing, letterpress printing, intaglio printing, lithography and ink jet method can be used.

It is desirable that conductivity of gate insulator 4 is equal to or less than $10^{-12}$ S/cm to control a leak current between metal electrodes (gate electrode 5, source electrode 6 and drain electrode 7). In addition, it is desirable for thickness of gate insulator 4 to be 50 nm-2 μm.

In addition, if material of gate insulator 4 and material of gas barrier layer 2 are same, an inexpensive transistor can be made.

Next, electrodes (gate electrode 5, source electrode 6 and drain electrode 7) are formed, and a transistor is obtained. (FIG. 1 (d))

For materials of electrodes (gate electrode 5, source electrode 6 and drain electrode 7), gold, platinum, silver, palladium, copper, aluminium, nichrome, chromium, titanium, indium, indium oxide, zinc oxide, tin oxide, cadmium oxide and gallium oxide can be used.

When transparent conducting oxide such as indium oxide, zinc oxide and tin oxide is used, it is desirable that conductivity of a metal electrode is increased by mixing dopant. For example, it is desirable that zinc oxide is retracted by mixing gallium, aluminium, boron or the like, and that tin oxide is retracted by mixing fluorine, antimony or the like, and that indium oxide is retracted by mixing tin, zinc, titanium, cerium, hafnium, zirconia or the like.

In addition, for increasing production efficiency, it is desirable that only dopant concentration is increased by using a electrode material which is same material as a mother material of a oxide semiconductor.

Film thickness of metal electrode has to be equal to or more than 15 nm at least.

In addition, materials of a gate electrode, a source electrode and a drain electrode may be identical or may be different from each other.

For a manufacturing method of electrodes (gate electrode 5, source electrode 6 and drain electrode 7), vacuum evaporation method, ion plating method, sputter method, laser ablation method, plasma CVD technique, photo-CVD, hot wire CVD method, spin coat method, dip coat method, screen printing, letterpress printing, intaglio printing, lithography and ink jet method can be used.

Figure 2:
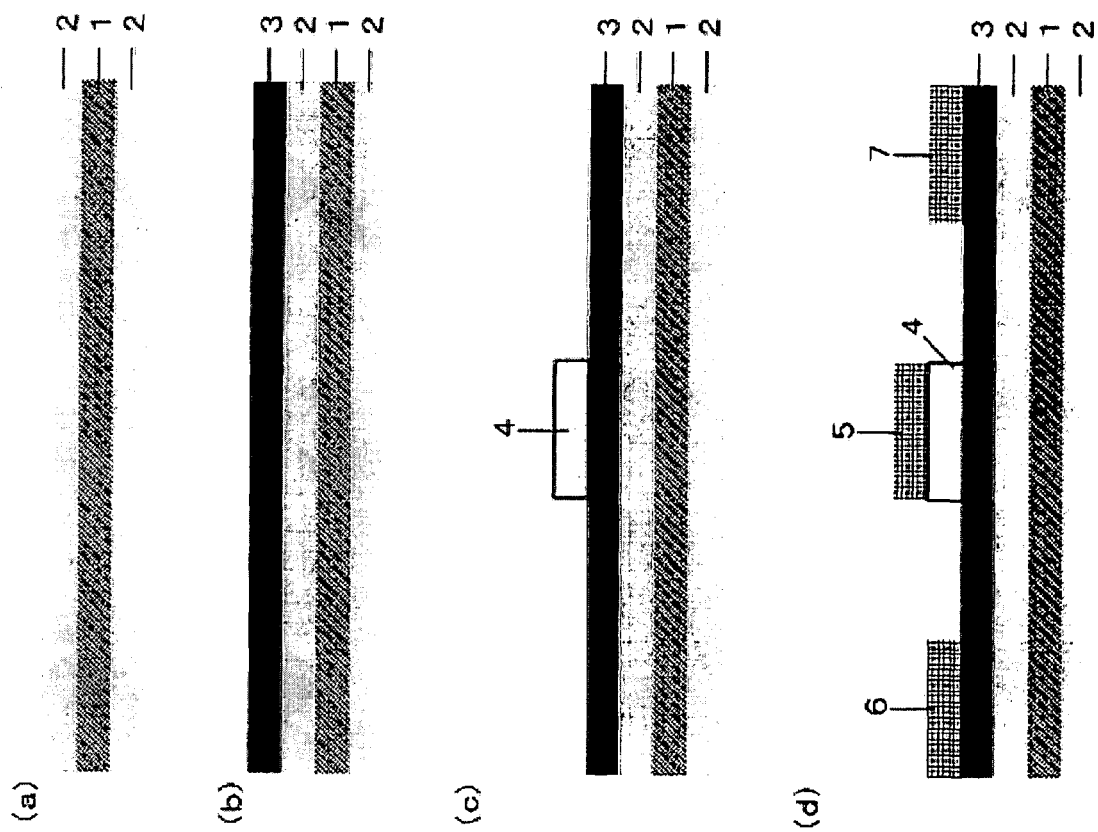
FIGS. 2 (*a*), (*b*), (*c*) and (*d*) are explanatory drawings which show a cross section structure of an example of a structure with a transistor of the present invention.

In addition, gas barrier layer 2 may be formed on both sides of plastic substrate 1. (FIG. 2 (d))

In the present invention, oxygen and water vapor from a plastic substrate are shielded by a gas barrier layer, and they do not go to an oxide semiconductor layer. And in the present invention, a flexible structure with a transistor of which characteristic is stable and of which mobility and on/off ratio are kept to be high is provided.

EXAMPLES

At first, aluminium oxide of different thickness was deposited on polyethylene terephthalate (PET) of 100 μm thickness by continuous roll-to-roll evaporation method using electron beam thermal process. Then, gas barrier property (water vapor transmission rate, oxygen transmission rate) was measured. In addition, to raise gas barrier property, aluminium oxide was deposited on both sides of PET film in Example 1, 2, 11, 12 and 13. (In addition, aluminium oxide was not deposited on PET film in Comparative Example.)

A semiconductor layer having film thickness of 40 nm was made on the PET with deposited aluminium oxide by RF magnetron sputtering technique [sputtering gas: Ar 19.4 SCCM, oxygen 0.6 SCCM (oxygen flow rate ratio 3%)] using $InGaZnO_4$ as a sputter target.

A gate insulator having film thickness of 170 nm comprising $Y_2O_3$ was made on one part of this semiconductor layer by RF magnetron sputtering technique [sputtering gas: Ar 1 SCCM, oxygen 20 SCCM] using $Y_2O_3$ as a sputter target.

Next, sputter was performed on this gate insulator and semiconductor layer by using 10% Sn doped $In_2O_3$ as a sputter target [sputtering gas: Ar 20 SCCM, oxygen 1 SCCM]. Then, a source electrode, a drain electrode and a gate electrode were made by photo-lithography method, where three areas of a source electrode, drain electrode and gate electrode were separated from each other, and a transistor was obtained.

As for the transistor, the channel-length was 50 μm and the channel width was 200 μm.

A manufacture condition was summarized in table 1.

TABLE 1

| | target | Temperature of a substrate (° C.) | Working pressure (Pa) | Gas flow rate (SCCM) | Input power (W) | Film thickness (nm) |
|---|---|---|---|---|---|---|
| Semiconductor layer | $InGaZnO_4$ | 40 | 0.5 | Ar: 19.4 $O_2$: 0.6 | 20 | 50 |
| Gate insulator | $Y_2O_3$ | 40 | 0.5 | Ar: 1 $O_2$: 020 | 30 | 150 |
| Source electrode Drain electrode Gate electrode | $In_2O_3$ (Sn 10% doped) | 40 | 0.5 | Ar: 20 $O_2$: 1 | 20 | 100 |

Figure 3:
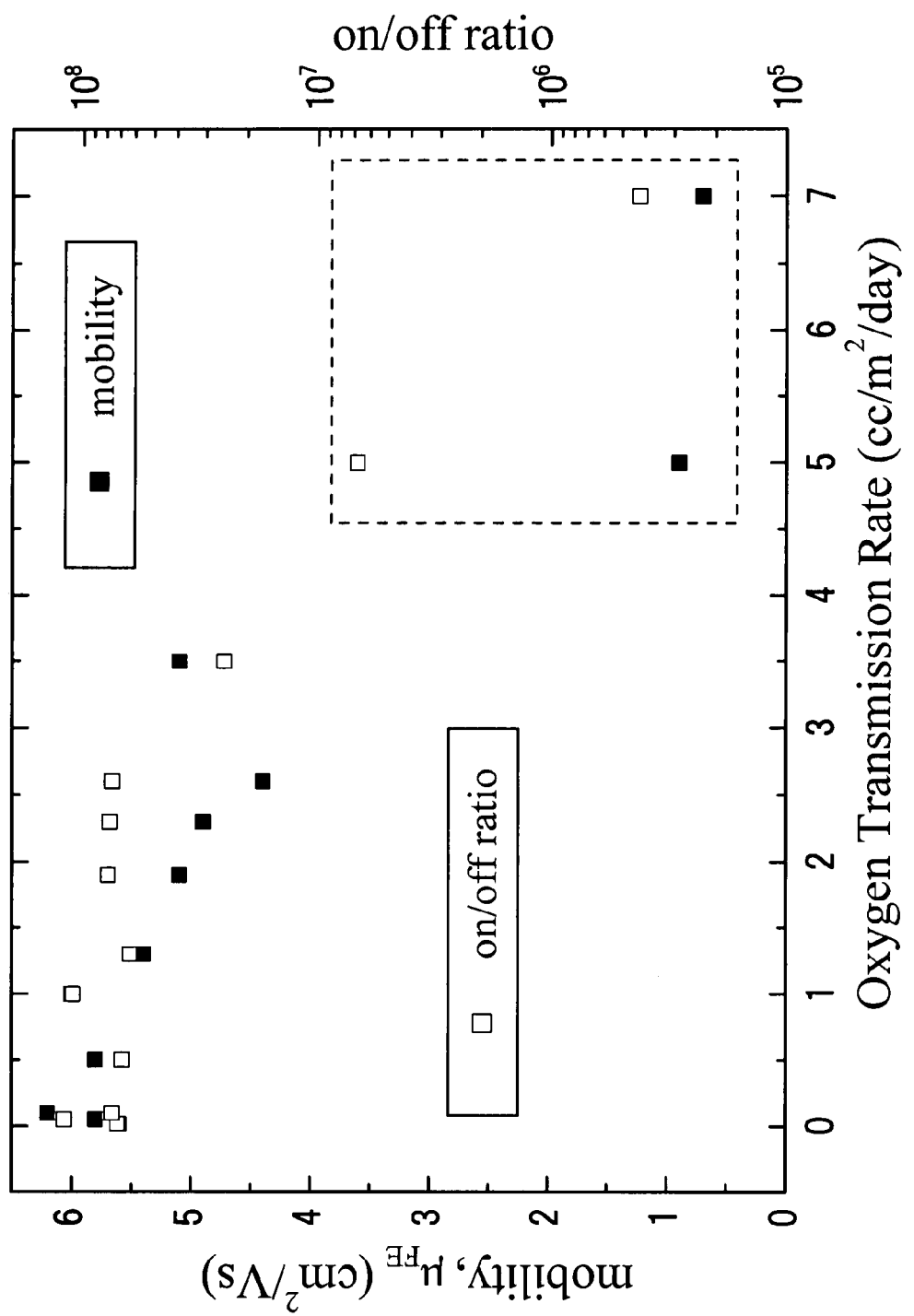
FIG. 3 is an explanatory drawing which shows relationships between an oxygen transmission rate of a gas barrier material and mobility and between an oxygen transmission rate of a gas barrier material and on/off ratio, about a structure with a transistor of the present invention.
Figure 4:
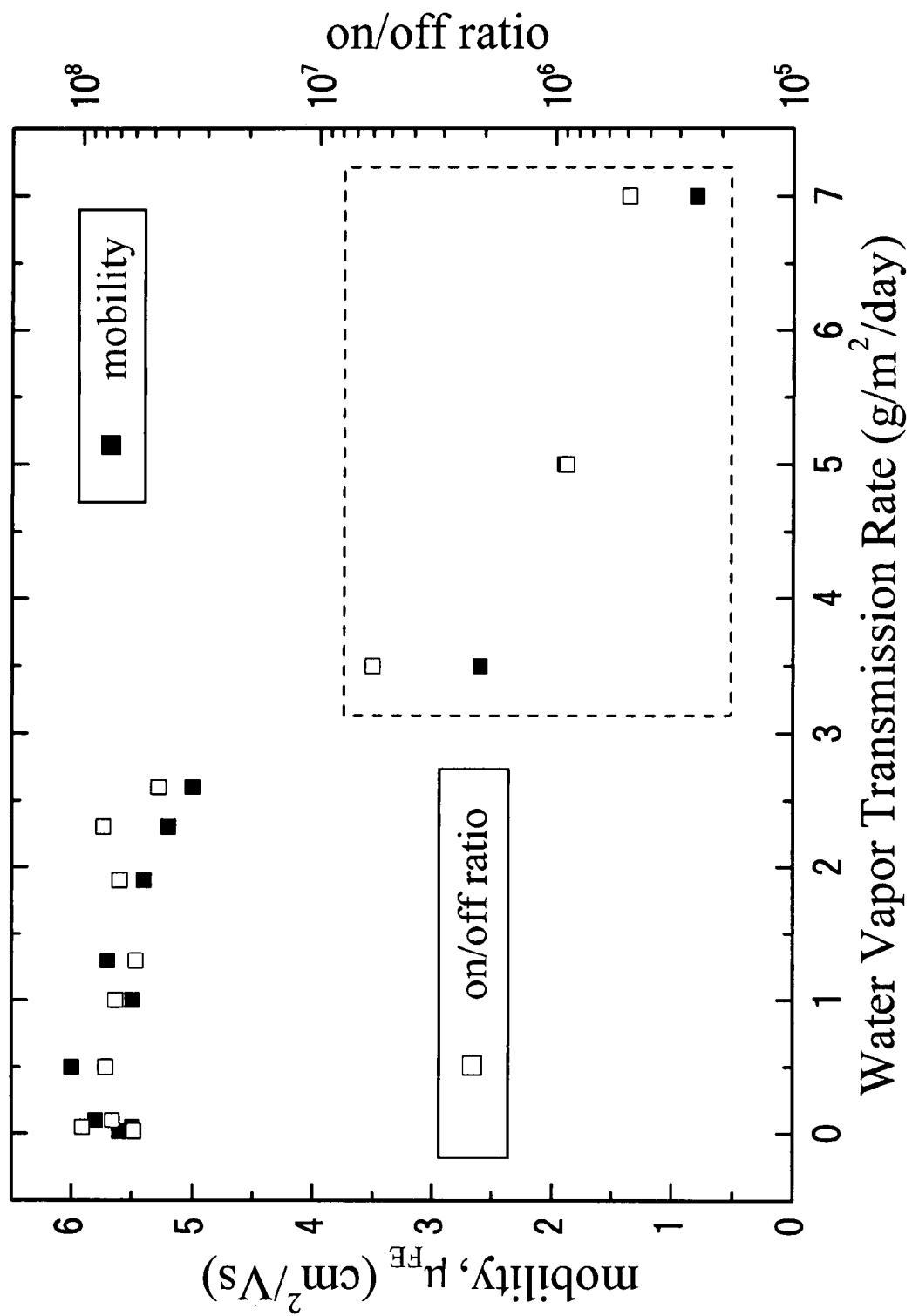
FIG. 4 is an explanatory drawing which shows relationships between a water-vapor transmission rate of a gas barrier material and mobility and between a water-vapor transmission rate of a gas barrier material and on/off ratio, about a structure with a transistor of the present invention.

After manufacturing samples, in measuring property of the transistor, an analyzer of parameters of a semiconductor (model name: Keithley 4200, a product of Keithley co.) was used, and mobility and on/off ratio was calculated based on transfer characteristic. The measured results are shown in FIGS. 3 and 4, and Table 2.

<Result of Example>

When an oxygen transmission rate of a gas barrier material of the transistor was equal to or less than 3.5 cc/m²/day/atm and water-vapor transmission of that is equal to or less than 3 g/m²/day, good characteristic was shown, that is, ON/OFF ratio was equal to or more than $10^7$ and mobility was equal to or more than 4 cm²/Vs.

<Result of Comparative Example>

In addition, as for the transistor without a gas barrier layer, ON/OFF ratio was less than $10^7$ and mobility was less than 3 cm²/Vs. Those values were not suitable for use of a transistor.

In addition, oxygen transmission rate of the PET on which aluminium oxide was deposited was measured under the conditions of temperature 30 degrees Celsius and humidity 70% RH by using an oxygen transmission rate measuring apparatus (a model name: OXTRAN made in Mocon company).

In addition, water-vapor transmission of the PET which aluminium oxide was deposited was measured under the conditions of temperature 40 degrees Celsius and humidity 90% RH by using a water-vapor transmission measuring apparatus (a model name: PERMATRAN made in Mocon company).

Oxygen Transmission Rate

| | $Al_2O_3$ thickness (nm) | side having $Al_2O_3$ | $O_2$TR (cc/m²/day) | Mobility (cm²/Vs) | On/off ratio |
|---|---|---|---|---|---|
| Example 1 | 52 | Both sides | 0.03 | 5.6 | $7.1 \times 10^7$ |
| Example 2 | 50 | Both sides | 0.06 | 5.8 | $1.2 \times 10^8$ |
| Example 3 | 47 | Both sides | 1.1 | 6.2 | $7.5 \times 10^7$ |
| Example 4 | 42 | Both sides | 0.4 | 5.8 | $6.8 \times 10^7$ |
| Example 5 | 47 | One side | 0.9 | 6 | $1.1 \times 10^8$ |
| Example 6 | 42 | One side | 1.4 | 5.4 | $6.3 \times 10^7$ |
| Example 7 | 37 | One side | 2.1 | 5.1 | $7.8 \times 10^7$ |
| Example 8 | 33 | One side | 2.4 | 4.9 | $7.7 \times 10^7$ |
| Example 9 | 27 | One side | 2.8 | 4.4 | $7.5 \times 10^7$ |
| Example 10 | 22 | One side | 3.2 | 5.1 | $2.5 \times 10^7$ |
| Reference Example 1 | 17 | One side | 5.1 | 0.9 | $6.8 \times 10^6$ |
| Reference Example 2 | 12 | One side | 6.9 | 0.7 | $4.2 \times 10^5$ |

Water Vapor Transmission Ratio

| | $Al_2O_3$ thickness (nm) | side having $Al_2O_3$ | WVTR (g/m²/day) | Mobility (cm²/Vs) | On/off ratio |
|---|---|---|---|---|---|
| Example 11 | 48 | Both sides | 0.02 | 5.6 | $6.1 \times 10^7$ |
| Example 12 | 45 | Both sides | 0.05 | 5.5 | $1 \times 10^8$ |
| Example 13 | 40 | Both sides | 0.1 | 5.8 | $7.5 \times 10^7$ |
| Example 14 | 50 | One side | 0.5 | 6 | $8 \times 10^7$ |
| Example 15 | 40 | One side | 1 | 5.5 | $7.3 \times 10^7$ |
| Example 16 | 30 | One side | 1.3 | 5.7 | $6 \times 10^7$ |
| Example 17 | 20 | One side | 1.9 | 5.4 | $7 \times 10^7$ |
| Example 18 | 15 | One side | 2.3 | 5.2 | $8.2 \times 10^7$ |
| Example 19 | 10 | One side | 2.6 | 5 | $4.8 \times 10^7$ |
| Reference Example 3 | 6 | One side | 3.5 | 2.6 | $6 \times 10^6$ |
| Reference Example 4 | 4 | One side | 5 | 1.9 | $9 \times 10^5$ |
| Reference Example 5 | 2 | One side | 7 | 0.8 | $4.9 \times 10^5$ |

Comparative Example

| | $Al_2O_3$ thickness (nm) | $O_2$TR (cc/m$^2$/day) | WVTR (g/m$^2$/day) | Mobility (cm$^2$/Vs) | On/off ratio |
|---|---|---|---|---|---|
| Comparative Example | No gas barrier layer | 19 | 7.5 | 0.2 | $3 \times 10^5$ |

What is claimed is:

1. A flexible structure with a transistor comprising:
a plastic film substrate;
a gas barrier layer made of $Al_2O_3$ of 10-52 nm thickness on the plastic film substrate; and
a transistor on the gas barrier layer,
wherein the transistor includes an oxide semiconductor layer directly formed on the gas barrier layer,
wherein a gate insulator, a source electrode and a drain electrode are formed on the oxide semiconductor layer,
wherein a gate electrode is formed on the gate insulator,
wherein an oxygen transmission rate of the plastic film substrate with the gas barrier layer is 0.9-3.5 cc/m$^2$/24 hours/1 atm,
and
wherein a water-vapor transmission rate of the plastic film substrate with the gas barrier layer is 0.5-3g/m$^2$/24 hours.

2. The flexible structure according to claim 1,
wherein the oxide semiconductor layer comprises In—Ga—Zn—O.

3. A display having the structure according to claim 1.

4. The flexible structure according to claim 1,
wherein a material of the electrodes and a mother material of the oxide semiconductor layer are same.

* * * * *